United States Patent
Li et al.

(10) Patent No.: US 10,207,284 B2
(45) Date of Patent: Feb. 19, 2019

(54) COATING MACHINE FOR APPLYING COATING AGENT

(71) Applicants: BOE Technology Group Co., Ltd., Beijing (CN); Hefei BOE Optoelectronics Technology Co., Ltd., Anhui (CN)

(72) Inventors: Kun Li, Beijing (CN); Lei Zhang, Beijing (CN); Zhuyi Luo, Beijing (CN); Jin Hu, Beijing (CN); Chang Zhang, Beijing (CN); Bin Wu, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 7 days.

(21) Appl. No.: 15/137,807

(22) Filed: Apr. 25, 2016

(65) Prior Publication Data
US 2016/0325295 A1    Nov. 10, 2016

(30) Foreign Application Priority Data

May 7, 2015 (CN) .......................... 2015 1 0230284

(51) Int. Cl.
*B05B 13/02* (2006.01)
*H01L 21/67* (2006.01)
(Continued)

(52) U.S. Cl.
CPC .......... *B05B 13/0278* (2013.01); *B05C 5/027* (2013.01); *B05C 5/0254* (2013.01); *B05C 5/0258* (2013.01); *H01L 21/6715* (2013.01); *B05C 5/0279* (2013.01); *B05C 17/00506* (2013.01)

(58) Field of Classification Search
CPC ........ B05B 1/202; B05B 1/14; B05C 13/0278
USPC ......... 118/313; 222/568, 567, 526; 239/566, 239/568, 597, 600, 602
See application file for complete search history.

(56) References Cited

U.S. PATENT DOCUMENTS 3,195,819 A * 7/1965 Watanabe ................. B05B 5/03
                                                                  239/117
3,954,345 A * 5/1976 Morris ..................... F16B 12/24
                                                                  403/297

(Continued)

FOREIGN PATENT DOCUMENTS

CN    101069265 A    11/2007
CN    201915143 U    8/2011
(Continued)

OTHER PUBLICATIONS

Jul. 5, 2018—(CN) First Office Action Appn 201510230284.8 with English Translation.

*Primary Examiner* — Karl Kurple
(74) *Attorney, Agent, or Firm* — Banner & Witcoff, Ltd.

(57) ABSTRACT

Disclosed is a coating machine. The coating machine includes: a movable component, a plurality of nozzles and a pump, the plurality of nozzles are sequentially arranged along the length direction of the movable component, the pump is configured for pumping coating agents into the nozzles, the movable component can drive the nozzles to move, and coating agents are coated on substrates by the nozzles with the movement of the nozzles.

12 Claims, 2 Drawing Sheets

(51) Int. Cl.
*B05C 5/02* (2006.01)
*B05C 17/005* (2006.01)

(56) References Cited

U.S. PATENT DOCUMENTS

| | | | | |
|---|---|---|---|---|
| 4,564,410 A * | 1/1986 | Clitheros | | B05C 5/0216 |
| | | | | 118/323 |
| 4,772,487 A * | 9/1988 | Gotoh | | G01N 35/028 |
| | | | | 118/712 |
| 4,938,994 A * | 7/1990 | Choinski | | B05C 5/0254 |
| | | | | 118/401 |
| 5,029,553 A * | 7/1991 | Cox | | B05B 5/001 |
| | | | | 118/627 |
| 5,074,244 A * | 12/1991 | Byers | | B05B 7/08 |
| | | | | 118/313 |
| 5,468,295 A * | 11/1995 | Marantz | | B05B 7/0861 |
| | | | | 118/300 |
| 5,622,747 A * | 4/1997 | Todd | | B05D 1/265 |
| | | | | 118/410 |
| 5,665,200 A * | 9/1997 | Fujimoto | | H01L 21/6715 |
| | | | | 156/345.18 |
| 5,718,763 A * | 2/1998 | Tateyama | | B05C 11/08 |
| | | | | 118/319 |
| 5,720,814 A * | 2/1998 | Takagi | | G03F 7/162 |
| | | | | 118/315 |
| 5,772,764 A * | 6/1998 | Akimoto | | G03F 7/162 |
| | | | | 118/302 |
| 5,816,506 A * | 10/1998 | Watanabe | | B05C 5/0254 |
| | | | | 118/410 |
| 5,858,466 A * | 1/1999 | Liu | | B05B 9/0403 |
| | | | | 118/603 |
| 6,376,013 B1 * | 4/2002 | Rangarajan | | B05C 11/02 |
| | | | | 118/319 |
| 6,821,550 B2 * | 11/2004 | Deguchi | | H01L 21/6715 |
| | | | | 118/313 |
| 8,828,149 B2 * | 9/2014 | Kwon | | G03F 7/422 |
| | | | | 134/64 R |
| 9,573,159 B2 * | 2/2017 | McGuffey | | |
| 9,718,081 B2 * | 8/2017 | McGuffey | | B05C 5/0225 |
| 2002/0007790 A1 * | 1/2002 | Park | | C23C 16/4405 |
| | | | | 118/715 |
| 2003/0031800 A1 * | 2/2003 | Leu | | H01L 21/6715 |
| | | | | 427/425 |
| 2005/0217573 A1 | 10/2005 | Kwon et al. | | |
| 2006/0119669 A1 * | 6/2006 | Sharma | | B41J 2/03 |
| | | | | 347/82 |
| 2007/0212884 A1 * | 9/2007 | Yamamoto | | G03F 7/11 |
| | | | | 438/694 |
| 2008/0192222 A1 | 8/2008 | Okada | | |
| 2008/0204490 A1 * | 8/2008 | Kojima | | B41J 2/14209 |
| | | | | 347/9 |
| 2009/0231368 A1 * | 9/2009 | Nakano | | B41J 2/145 |
| | | | | 347/8 |
| 2011/0059246 A1 * | 3/2011 | Miyamoto | | H01L 21/6715 |
| | | | | 427/345 |
| 2014/0322449 A1 | 10/2014 | Ku et al. | | |
| 2015/0328649 A1 * | 11/2015 | Carcasi | | B05B 7/26 |
| | | | | 427/426 |
| 2016/0114340 A1 * | 4/2016 | Choi | | H01M 4/0404 |
| | | | | 239/135 |
| 2016/0250851 A1 * | 9/2016 | Yao | | B41J 2/145 |
| | | | | 29/890.1 |
| 2016/0256889 A1 * | 9/2016 | Jones | | B05C 5/0225 |
| 2016/0256892 A1 * | 9/2016 | Cheng | | H01L 51/0005 |
| 2016/0354800 A1 * | 12/2016 | Birecki | | B05C 1/0813 |
| 2017/0072411 A1 * | 3/2017 | Ayers | | B05C 5/001 |
| 2017/0140950 A1 * | 5/2017 | Li | | B05B 13/02 |

FOREIGN PATENT DOCUMENTS

| | | |
|---|---|---|
| CN | 102221784 A | 10/2011 |
| CN | 202166827 U | 3/2012 |
| CN | 102693901 A | 9/2012 |
| CN | 102909954 A | 2/2013 |
| CN | 103019048 A | 4/2013 |
| CN | 103246165 A | 8/2013 |
| TW | 200532379 A | 10/2005 |

* cited by examiner

COATING MACHINE FOR APPLYING COATING AGENT

This application claims priority to and the benefit of Chinese Patent Application No. 201510230284.8 filed on May 7, 2015, which application is incorporated herein in its entirety.

TECHNICAL FIELD

Embodiments of the present invention relate to a technical field of mechanical device, especially relate to a coating machine.

BACKGROUND

Coating machine is a common device in coating technology for thin film field effect transistor liquid crystal displays (FET-LCDs), and is configured to apply coating agent on glass substrates of liquid crystal displays (LCD).

An existing coating machine comprises a nozzle which applies coating agents on a glass substrate. However, the length of the nozzle is relatively long, it is resulted in that the coating agents pumped in the nozzle are not distributed uniformly, and the coating uniformity is low. In addition, when the nozzle is in abnormal situations of being damaged, blocked or scratched etc., it is inconvenient for replacing and repairing the nozzle, and it has a high cost in replacement.

SUMMARY

In first respect of the present invention, there is provided a coating machine, which comprises: a movable component, a plurality of nozzles and a pump, wherein the plurality of nozzles are sequentially arranged along a length direction of the movable component, the pump is configured for pumping coating agents into the nozzles, and the movable component is configured for moving the nozzles.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise clearly defined and limited, the terms "mount", "connect", and "connected" used herein should be understood broadly, for example, that may be a fixed connection, a knock-down connection, or an integrated connection; that may be a mechanical connection or an electrical connection; that may be a direct connection, or an indirect connection by an intermedia, or an inner connection between two components. The term "a plurality of" refers to two or more than two.

Figure 1:
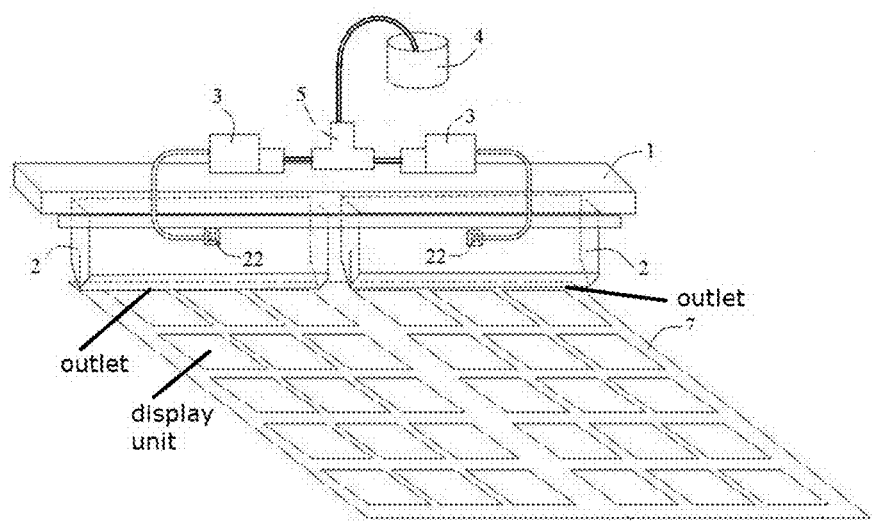
FIG. 1 schematically illustrates a coating machine according to an embodiment of the present invention.

An embodiment of the present invention provides a coating machine, which is configured to apply coating agent, as illustrated in FIG. 1, the coating machine comprises: a movable component 1, a plurality of nozzles 2 and a pump 3. Herein, the plurality of nozzles 2 are sequentially arranged along a length direction of the movable component 1; the pump 3 is configured for pumping the coating agent into the plurality of nozzles 2; the movable component 1 can bring the nozzles 2 to move, and the coating agent is applied on a substrate 7 by the nozzles 2 with the movement of the nozzles 2.

Because the plurality of nozzles 2 are sequentially arranged along the length direction of the movable component 1 and the pump 3 is configured for pumping the coating agent into the nozzles 2, the length of the nozzles 2 are shortened. As a result, the distribution of the coating agent pumped into the individual nozzle 2 is more uniform, and the coating uniformity is increased. In addition, when any one of the nozzles 2 is in abnormal situations of being damaged, blocked or scratched etc., the coating machine facilitates to replace or repair the corresponding nozzle 2, because the length of the individual nozzle 2 is shorter, not only are the replacement and repairment of the nozzle more convenient, but also the cost of replacement is reduced.

For example, there is provided a plurality of pumps 3, and the plurality of pumps 3 are connected with the plurality of nozzles 2 in one-to-one correspondence, that is, the amount of the coating agent pumped into each nozzle 2 is controlled by one of the pumps 3, thus, it is convenient to adjust the amount of the coating agent pumped into the respective nozzles 2, and then the uniformity of coating is increased.

In order to make the structure of the coating machine more compact, for example, a coating machine according to an embodiment of the present invention further comprises: a container 4 and a diverter valve 5. An inlet of the diverter valve 5 is connected with the container 4, a plurality of outlets of the diverter valve 5 are connected respectively with inlets of the plurality of pumps 3 in one-to-one correspondence. The coating agent flowed from the container 4 is flowed into the inlet of the diverter valve 5 through a pipeline, and then the coating agent is flowed into the respective pumps 3 through the plurality of outlets of the diverter valve 5, thus the pipelines for connecting a plurality of pumps 3 and the container 4 are reduced, the structure of the coating machine is more compact.

Figure 2:
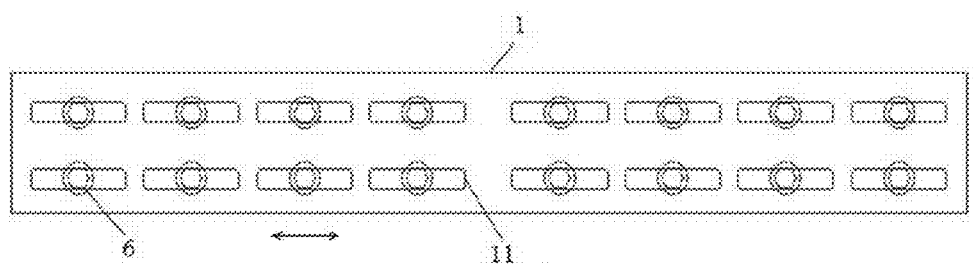
FIG. 2 is a top view of a movable component according to an embodiment of the present invention.
Figure 3:
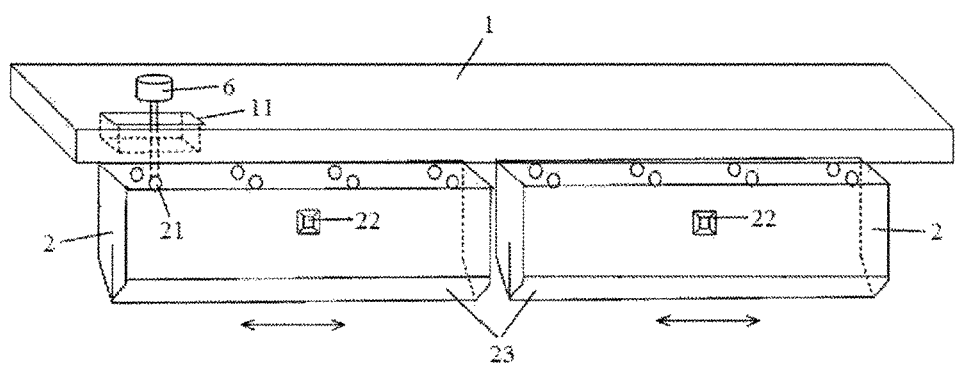
FIG. 3 schematically illustrates a nozzle head according to an embodiment of the present invention.

For example, the movable component 1 and the nozzle 2 are connected by a bolt 6. As illustrated in FIG. 2 and FIG. 3, a plurality of via holes 11 are disposed on the movable component 1, a bolt 6 is disposed in each via hole 11. Threaded holes 21 are disposed on each nozzle 2. The bolts 6 are matched with threaded holes 21 disposed on the nozzles 2 through the corresponding via holes 11, therefore, the connection between the movable component 1 and the nozzle 2 is more reliable, the nozzle 2 can be removed easily when it is in abnormal situations of being damaged, blocked or scratched etc.

In order to reduce the waste of the coating agent, for example, the via hole 11 according to an embodiment of the present invention is a strip-shaped hole, the length direction of the strip-shaped hole is parallel to the length direction of the movable component 1. During the movement of the movable component 1, when the non-coated area of the substrate 7 exists along the movement direction of the movable component 1, the bolt 6 is loosened, and the nozzle 2 together with the bolt 6 is shifted along the length direction of the strip-shaped hole. The moving direction of the bolt 6 is indicated by an arrow in FIG. 2, and the moving direction of the nozzle 2 is indicated by an arrow in FIG. 3. As the nozzle 2 is avoided from the non-coated area, the waste of the coating agent is reduced and the cost is reduced too.

Further, in order to increase the stability of the connection between the movable component 1 and the nozzle 2, for example, as illustrated in FIG. 2, a plurality of strip-shaped holes 11 are arranged in two rows along the moving direction of the movable component 1, and the plurality of threaded holes 21 disposed on the nozzle 2 are in one-to-one correspondence with the strip-shaped holes 11. A plurality of bolts 6 are matched with the threaded holes 21 disposed on the nozzles 2 through the corresponding strip-shaped holes, therefore, the stability of the connection between the movable component 1 and the nozzle 2 is increased.

As an example, the outlet of the pump 3 is connected with the inlets 22 of the plurality of nozzles 2, the coating agent is pumped into corresponding nozzles 2 through a plurality of inlets 22. The inlet 22 of the nozzle 2 can be disposed on the top surface of the nozzle 2 or on the side surface being parallel with the length direction of the movable component 1. When the inlet 22 is disposed on the top surface of the nozzle 2, because the thickness of the nozzle 2 along the moving direction of the movable component 1 is relatively small, the diameter of the inlet 22 is relatively small, then the pumped amount of the coating agent along the length direction of the movable component 1 is relatively small, and the uniformity of the coating is relatively low; as illustrated in FIG. 1 and FIG. 3, when the inlet 22 is disposed on the side surface being parallel with the length direction of the movable component 1, because the height of the nozzle 2 is relatively high, the diameter of the inlet 22 can be set bigger, then the pumped amount of the coating agent along the length direction of the movable component 1 is increased, the uniformity of the coating is increased. Therefore, the inlet 22 of the nozzle 2 is disposed on the side surface being parallel with the length direction of the movable component 1 according to an embodiment of the present invention.

The pump 3 is a P (Pressure) T (Time) pump, the PT pump can accurately control the volume of the coating agent transported from the container 4, then the accuracy of the amount of coating agent pumped into each nozzle is increased, and the coating uniformity of the coating machine is increased.

The coating agent is applied on the substrate 7 with the movement of the nozzle 2 driven by the movable component 1. During the coating process, a nozzle head 23 of nozzle 2 is usually scratched by a foreign body, in order to avoid the above problem, as illustrated in FIG. 3, according to an embodiment of the present invention, the nozzle 2 comprises a nozzle head 23, the material of nozzle head 23 is cemented carbide. For example, it may be made of the cemented carbide with hardness of HRC 76.1, in this way, the nozzle head 23 can be effectively protected from being scratched, and the times for repairment are reduced.

For example, in the coating processes of manufacturing a color filter or a TFT of a liquid crystal display, the coating agent may be a photoresist, the photoresist stored in the container 4 is pumped into each nozzle 2 respectively by the pump 3. The photoresist is applied on a glass substrate of liquid crystal display through the nozzle 2 driven by the movable component 1. In other embodiments, the coating agent may be other materials used for coating, such as luminescent material, sealant, etc.

Because a plurality of nozzles are sequentially arranged along the length direction of the movable component and the pump is configured for pumping coating agent into the nozzles, the length of the nozzles are shortened. As a result, the distribution of coating agents pumped into a single nozzle is more uniform, and the coating uniformity is increased. In addition, when any one of the nozzles is in abnormal situations of being damaged, blocked or scratched etc., the coating machine facilitates to replace or repair the corresponding nozzle, because the length of the individual nozzle is shorter, not only are the replacement and repairment of the nozzle more convenient, but also the cost of replacement is reduced.

What is described above is related to the illustrative embodiments of the disclosure only and not limitative to the scope of the disclosure; the scopes of the disclosure are defined by the accompanying claims.

The present application claims the priority of Chinese patent application No. 201510230284.8 filed on May 7, 2015, the disclosure of which is hereby incorporated by reference herein in its entirety.

The invention claimed is:

1. A coating machine for applying a coating agent, comprising: a movable component, a plurality of nozzles, and a pump, wherein the plurality of nozzles are sequentially arranged along a length direction of the movable component, the pump is configured for pumping the coating agent into the plurality of nozzles, and the movable component is configured for moving the plurality of nozzles in a direction parallel to the length direction of the movable component, wherein a plurality of via holes are disposed in the movable component, a bolt is disposed in each of the via holes and extended along a direction perpendicular to the length direction of the movable component, a threaded hole is disposed in each of the nozzles, and each corresponding bolt is matched with a corresponding threaded hole through a corresponding one of the via holes; each nozzle is attached by the corresponding bolt, wherein the corresponding bolt extends vertically from the corresponding via hole into the corresponding threaded hole of the nozzle, wherein each of the via holes is in a shape of a rectangle, a length direction of the via holes is parallel to the length direction of the movable component, and wherein a width of the one of the via holes is larger than a width of the bolt, and the corresponding bolt and the corresponding nozzle are configured for shifting in the corresponding via hole in the length direction of the via holes.

2. The coating machine according to claim 1, further comprising a plurality of pumps, and wherein the plurality of pumps are connected with the plurality of nozzles in a one-to-one correspondence.

3. The coating machine according to claim 2, further comprising: a container and a diverter valve, wherein an inlet of the diverter valve is connected with the container, and wherein a plurality of outlets of the diverter valve are connected respectively with inlets of the plurality of pumps in a one-to-one correspondence.

4. The coating machine according to claim 1, wherein the plurality of via holes are arranged in two rows along a moving direction of the movable component, threaded holes disposed in the plurality of nozzles are in a one-to-one correspondence with the via holes, a plurality of bolts are matched with the threaded holes disposed in the plurality of nozzles through corresponding via holes arranged in two rows.

5. The coating machine according to claim 1, wherein each nozzle of the plurality of nozzles is provided with an inlet which is disposed on a side surface of the nozzle being parallel with the length direction of the movable component, and wherein an outlet of the pump is connected with the inlet.

6. The coating machine according to claim 1, wherein the pump is a pressure-time (PT) pump.

7. The coating machine according to claim 1, wherein at least one nozzle of the plurality of nozzles comprises a nozzle head, and a material of the nozzle head is cemented carbide.

8. The coating machine according to claim 1, wherein the coating agent is applied on a substrate by the plurality of nozzles, and wherein the coating agent is a photoresist.

9. The coating machine according to claim 1, wherein the pump pumps a same coating agent to the plurality of nozzles.

10. The coating machine according to claim 2, wherein the plurality of pumps pump a same coating agent to the plurality of nozzles.

11. The coating machine according to claim 1, wherein at least one nozzle of the plurality of nozzles comprises a nozzle head, and the nozzle head comprises an outlet being of a straight-line shape.

12. The coating machine according to claim 11, wherein a width of the outlet in the length direction of the movable component is larger than a width of at least one liquid crystal display unit on a substrate.

* * * * *